United States Patent
Huang et al.

(10) Patent No.: US 8,313,992 B2
(45) Date of Patent: Nov. 20, 2012

(54) METHOD OF PATTERNING NAND STRINGS USING PERPENDICULAR SRAF

(75) Inventors: Chen-Che Huang, Campbell, CA (US); Chun-Ming Wang, Fremont, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 296 days.

(21) Appl. No.: 12/897,257

(22) Filed: Oct. 4, 2010

(65) Prior Publication Data
US 2012/0083124 A1    Apr. 5, 2012

(51) Int. Cl.
- H01L 21/336 (2006.01)
- H01L 21/8234 (2006.01)
- G03F 1/00 (2006.01)
- C03C 15/00 (2006.01)
- C03C 25/68 (2006.01)
- C23F 1/00 (2006.01)

(52) U.S. Cl. .............. 438/197; 430/5; 216/41
(58) Field of Classification Search .......... 438/197; 216/41
See application file for complete search history.

(56) References Cited

U.S. PATENT DOCUMENTS

| | | |
|---|---|---|
| 6,541,165 B1 | 4/2003 | Pierrat |
| 7,033,734 B2 | 4/2006 | Chandhok |
| 7,632,610 B2 | 12/2009 | Wallace |
| 2002/0192570 A1 | 12/2002 | Smith |
| 2004/0197677 A1 | 10/2004 | Kohle et al. |
| 2006/0200790 A1 | 9/2006 | Shang |
| 2008/0248621 A1* | 10/2008 | Kai et al. ............ 438/257 |
| 2009/0029267 A1* | 1/2009 | Cho ............ 430/5 |
| 2009/0142706 A1 | 6/2009 | Masukawa et al. |
| 2009/0191468 A1 | 7/2009 | Crouse |

OTHER PUBLICATIONS

International Search Report and Written Opinion issued in PCT Application No. PCT/US2011/054181, mailed on Feb. 14, 2012.

* cited by examiner

*Primary Examiner* — Binh X Tran
*Assistant Examiner* — Thomas Pham
(74) *Attorney, Agent, or Firm* — The Marbury Law Group PLLC

(57) ABSTRACT

A lithography mask includes a plurality of patterning features formed on a mask substrate and a first plurality of sub-resolution assist features (SRAFs) formed substantially perpendicular to the patterning features on the mask substrate.

9 Claims, 5 Drawing Sheets

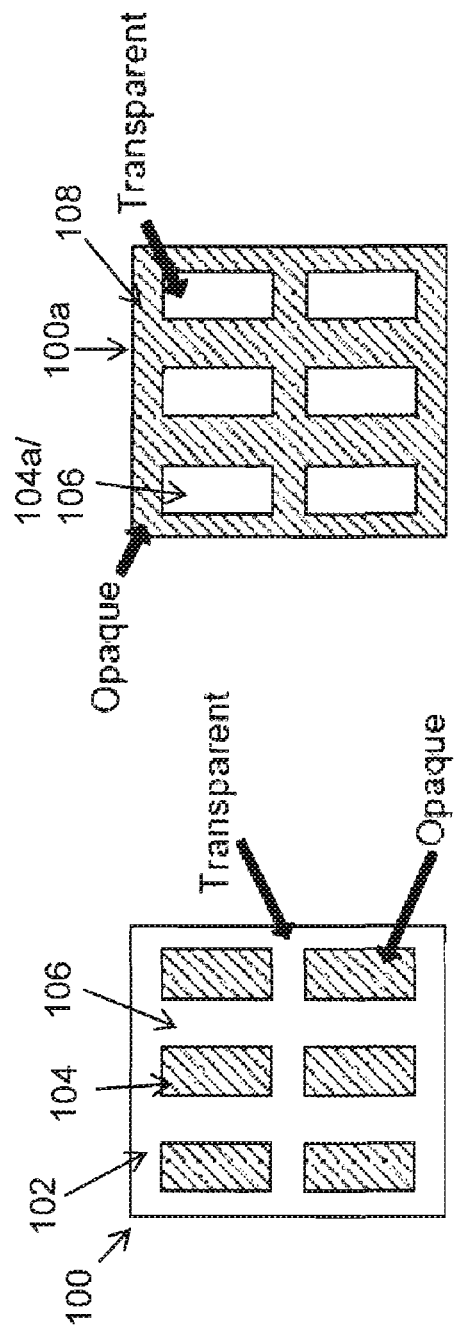
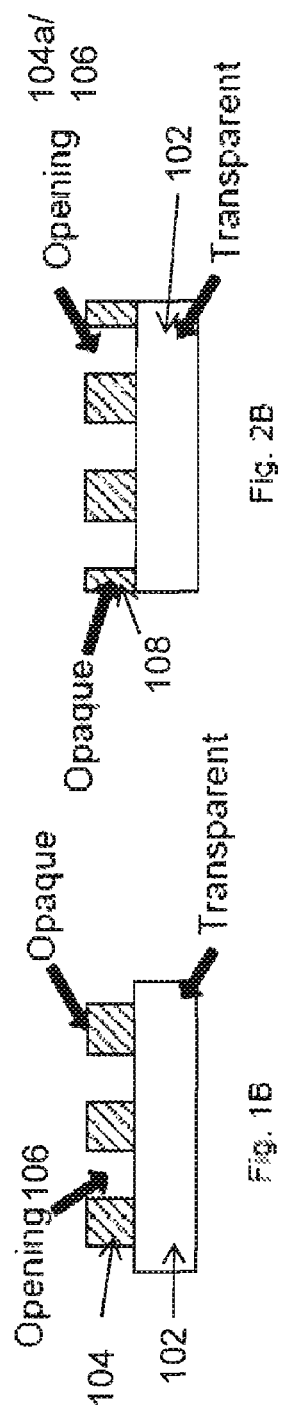

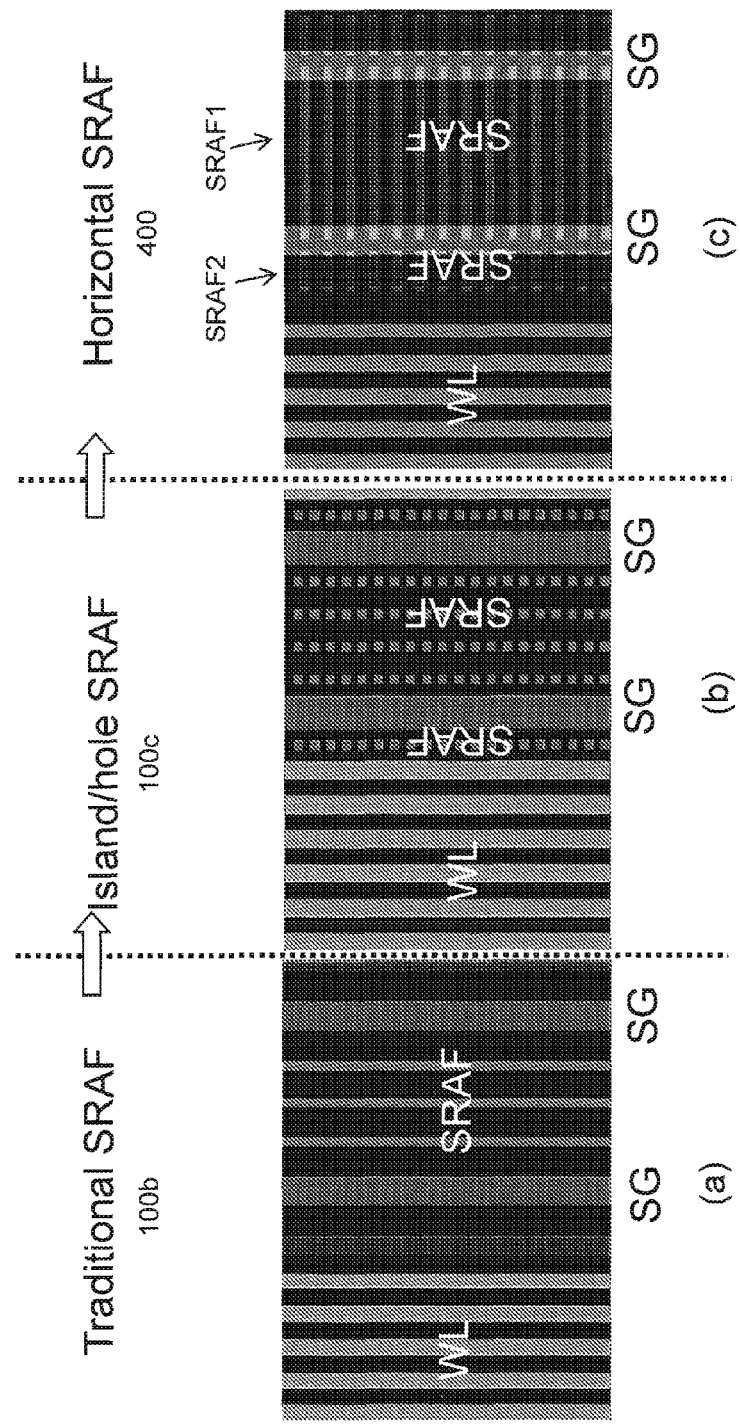

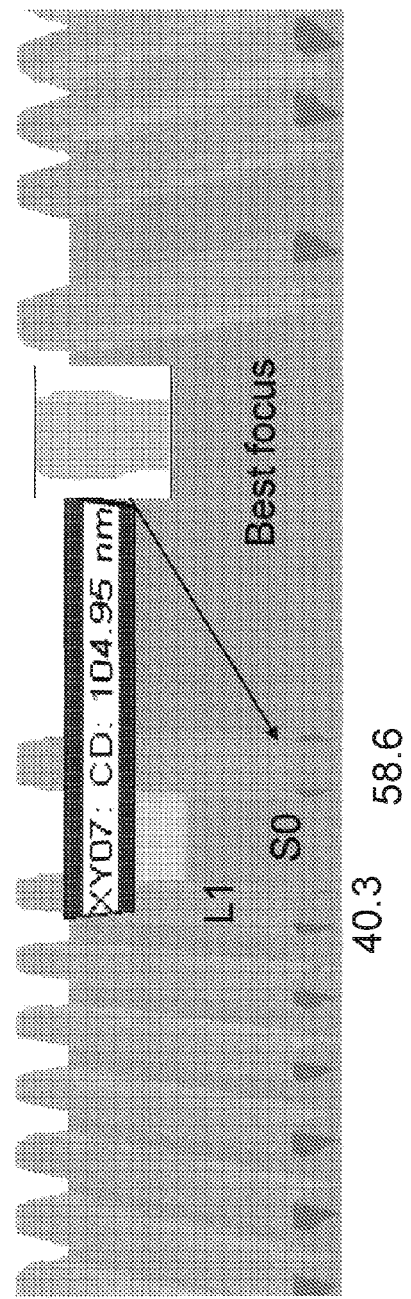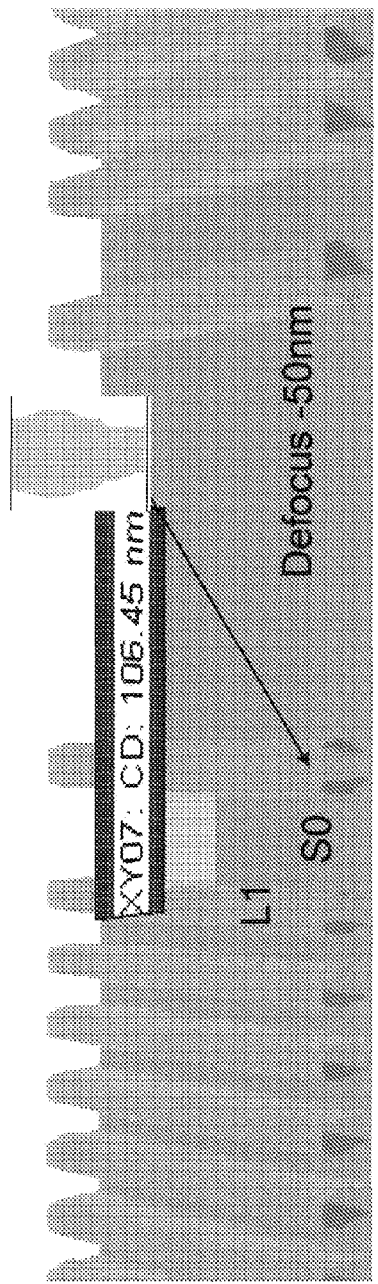

METHOD OF PATTERNING NAND STRINGS USING PERPENDICULAR SRAF

FIELD

The present invention generally relates to semiconductor devices, and more particularly to, lithographic fabrication of semiconductor devices.

BACKGROUND

Lithography masks used in the fabrication of semiconductor devices have a topography. The topography changes, alters and/or blocks radiation passing therethrough in the exposure of a photoresist layer over the semiconductor device layers. Optics are used to focus radiation as it is sent through the mask. While the optics are very precise, the physics of producing a semiconductor device with small dimensions results in discrepancies between the topographies of the mask and the semiconductor device to the extent that modifications to the mask topography will aid in creating the semiconductor device with the desired topography.

Several techniques have been developed that facilitate the fabrication of a semiconductor device with a desired topography. Exemplary techniques include selective attenuation (e.g., using binary photomasks), interference (e.g., using phase shifting masks), reflection (e.g., using extreme ultraviolet reflective optical elements), and beam steering. Sub-resolution assist features (SRAF) have been used to improve performance of masks, such as phase shifting masks. The complex design of modern semiconductor devices which rely on features with increasingly smaller dimensions, however, require improvements in phase shifting masks.

SUMMARY

An embodiment relates to a lithography mask. The lithography mask includes a plurality of patterning features formed on a mask substrate and a first plurality of sub-resolution assist features (SRAFs) formed on the mask substrate. The plurality of patterning features are dimensioned equal to or greater than a resolution limit of a lithography system used with the lithography mask, the lithography system having a lithography radiation source. Each of the plurality of patterning features has a length greater than a width. The plurality of patterning features extend in a first longitudinal direction along their length on the mask substrate. The first plurality of SRAFs are dimensioned less than a resolution limit of the lithography system used with the lithography mask. Each of the first plurality of SRAFs has a length greater than a width. The first plurality of SRAFs extend in a second longitudinal direction along their length on the mask substrate, where the second longitudinal direction is substantially perpendicular to the first longitudinal direction. The first plurality of SRAFs are located between two adjacent patterning features. A first end of each of the first plurality of SRAFs connects to a side of a first of the two adjacent patterning features and a second end of each of the first plurality of SRAFs connects to a side of a second of the two adjacent patterning features.

Another embodiment relates to a method of making a patterned photoresist layer. The method includes exposing the photoresist layer to radiation though a lithography mask. The lithography mask includes a plurality of patterning features formed on a mask substrate and a first plurality of sub-resolution assist features (SRAFs) formed on the mask substrate. The plurality of patterning features are dimensioned equal to or greater than a resolution limit of a lithography system used with the lithography mask, the lithography system having a lithography radiation source. Each of the plurality of patterning features has a length greater than a width. The plurality of patterning features extend in a first longitudinal direction along their length on the mask substrate. The first plurality of SRAFs are dimensioned less than a resolution limit of the lithography system used with the lithography mask. Each of the first plurality of SRAFs has a length greater than a width. The first plurality of SRAFs extend in a second longitudinal direction along their length on the mask substrate, where the second longitudinal direction is substantially perpendicular to the first longitudinal direction. The first plurality of SRAFs are located between two adjacent patterning features. A first end of each of the first plurality of SRAFs connects to a side of a first of the two adjacent patterning features and a second end of each of the first plurality of SRAFs connects to a side of a second of the two adjacent patterning features. The method also includes selectively removing portions of the photoresist layer such that photoresist patterns corresponding to the plurality of patterning features are formed and no photoresist patterns corresponding to the SRAFs are formed.

Another embodiment relates to a method of making a NAND string. The method includes depositing a photoresist layer over a NAND gate layer located over a substrate and exposing the photoresist layer to radiation though a lithography mask. The lithography mask includes a plurality of patterning features formed on a mask substrate and a first plurality of sub-resolution assist features (SRAFs) formed on the mask substrate. The plurality of patterning features are dimensioned equal to or greater than a resolution limit of a lithography system used with the lithography mask, the lithography system having a lithography radiation source. Each of the plurality of patterning features has a length greater than a width. The plurality of patterning features extend in a first longitudinal direction along their length on the mask substrate. The plurality of patterning features correspond in shape to NAND select gates and NAND control gates. The first plurality of SRAFs are dimensioned less than a resolution limit of the lithography system used with the lithography mask. Each of the first plurality of SRAFs has a length greater than a width. The first plurality of SRAFs extend in a second longitudinal direction along their length on the mask substrate, where the second longitudinal direction is substantially perpendicular to the first longitudinal direction. The first plurality of SRAFs are located between two adjacent patterning features. A first end of each of the first plurality of SRAFs connects to a side of a first of the two adjacent patterning features and a second end of each of the first plurality of SRAFs connects to a side of a second of the two adjacent patterning features. The method also includes selectively removing portions of the photoresist layer such that photoresist patterns corresponding to the plurality of patterning features are formed and no photoresist patterns corresponding to the SRAFs are formed and etching the NAND gate layer using the photoresist patterns as a mask to form a plurality of NAND control gates and select gates.

BRIEF DESCRIPTION OF THE DRAWINGS

FIG. 1A illustrates a plan view of a lithography mask with a transparent substrate and substantially opaque patterning features.

FIG. 1B illustrates a side cross sectional view of the lithography mask of FIG. 1A.

FIG. 2A illustrates a plan view of a lithography mask with a transparent substrate and transparent patterning features.

FIG. 2B illustrates a side cross sectional view of the lithography mask of FIG. 2A.

FIG. 4 is a side by side comparison of lithography masks including: (a) conventional SRAF, (b) conventional island/hole SRAF, and (c) an embodiment of horizontal SRAF.

FIG. 6A is a simulation of a pattern produced with an embodiment of horizontal SRAF lithography mask with a focused radiation source.

FIG. 6B is a simulation of a pattern produced with an embodiment of horizontal SRAF mask with a defocused radiation source.

DETAILED DESCRIPTION

Figure 3A:
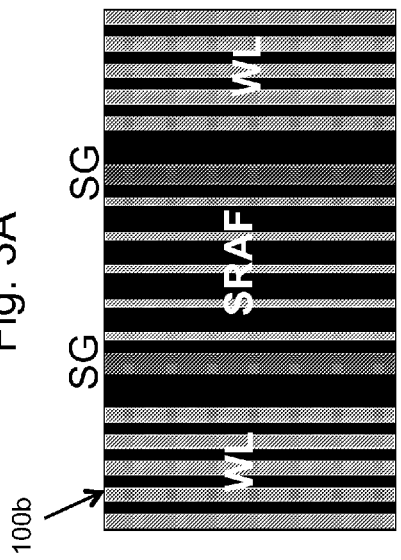
FIG. 3A illustrates a conventional lithography mask for a NAND string.

Photolithography is a process used in semiconductor device microfabrication to selectively remove parts of a thin film or of the bulk substrate. The process uses radiation to transfer a geometric pattern from a photomask to a radiation-sensitive chemical photoresist or another radiation sensitive layer on the thin film or substrate. Typical radiation sources include optical, ultraviolet, x-ray and electron beam sources. Radiation sources commonly used in immersion lithography emit peak wavelengths at 193 nm. However, other wavelengths are possible.

To produce patterns with extremely small pitches in a photoresist, a phase shifting mask (PSM) may be used in conjunction with a dipole lens. PSMs cause the shifting of the phase of a radiation source so that the peaks of one wave of radiation emitted by the radiation source lines up with the valleys of an adjacent wave (dipole illumination), effectively canceling each other out and producing a dual-beam image (a "shadow" image) between the waves that is smaller than the two waves themselves. The dual-beam image may be used to fabricate patterns having pitches as low as one-half the theoretical minimum pitch of the radiation source. In the PSM fabrication technique, radiation source beams are transmitted through zero degrees and 180 degrees and, when passing through the PSM mask, result in cancellation of the zero degree order of the radiation.

As used herein, a "patterning feature" is a feature on a photolithography mask that is configured to produce a substantially corresponding feature in a photoresist layer. Patterning feature may have a length and a width. If the length and width are different, the length denotes the longer of the two dimensions. A "sub-resolution assist feature" (SRAF) is an opaque feature on the mask that is placed between two phase shift patterning regions to improve the shape of the resulting exposed and unexposed regions in the photoresist. Preferably, the SRAFs do not "print" in the photoresist being exposed but affect the radiation intensity profile at the photoresist. SRAFs improve the contrast of the image and thereby improve the definition of the printed image caused by the phase shift region in which the sub-resolution assist feature is placed. The plurality of patterning features are dimensioned equal to or greater than a resolution limit of a lithography system used with the lithography mask. The SRAFs are dimensioned less than a resolution limit of the lithography system used with the lithography mask. Preferably SRAFs has a length greater than a width.

Like patterning features, SRAFs may a length and width. A "vertical" SRAF is a SRAF whose longitudinal direction (i.e., the longer direction) is substantially parallel to the longitudinal direction of the patterning feature the SRAF is intended to improve. A "horizontal" SRAF is a SRAF whose longitudinal direction is substantially perpendicular to the longitudinal direction of the patterning feature the SRAF is intended to improve. "Substantially parallel" means plus or minus 3 degrees. That is, from −3 to 3 degrees. "Substantially perpendicular" means plus or minus 3 degrees. That is, from 87 to 93 degrees.

A "photoresist" may be defined as a radiation sensitive material used in the process of photolithography to form a patterned coating on a surface. Photoresists are typically categorized as either positive or negative. Positive photoresist regions become more sensitive to chemical etching when selectively exposed to radiation and are removed in the developing process. Negative photoresist regions, in contrast, become resistant to chemical etching when selectively exposed to radiation. When using negative photoresist, the unexposed areas of the photoresist are removed during the developing process.

Additionally, as used herein, a material that is "substantially opaque" is one that has a radiation transmission of less than 10% in a radiation wavelength or frequency of interest. Preferably, the radiation transmission is 5-6%. The substantially opaque materials as used herein may optionally have a 180 degree phase change angle. "Substantially transparent" material has a radiation transmission of greater than 75% in a radiation wavelength or frequency of interest. The substantially opaque material includes but is not limited to chromium or molybdenum silicide. The material which is substantially transparent includes but is not limited to glass or quartz.

FIGS. 1A and 1B illustrate a first type of a conventional lithography mask 100. The first conventional lithography mask 100 includes a transparent substrate 102 and a layer of substantially opaque material that has been patterned to form substantially opaque patterning features 104. Openings 106 are located between and separate the patterning features in the layer of substantially opaque material. The openings 106 extend to the surface of the transparent substrate 102.

The first conventional lithography mask 100 is preferably used in conjunction with a positive photoresist. The mask 100 may be interposed between a radiation source and a wafer or device die with a photoresist layer on top. Radiation from the radiation source passes through the transparent substrate and the openings 106 between substantially opaque patterning features 104 to the positive photoresist below. The exposed positive photoresist is developed, that is, rendered more sensitive to chemical etching. The unexposed positive photoresist, corresponding to the patterning features 104, can be removed by ashing or any other suitable technique, leaving a patterned positive photoresist layer (i.e., rail shaped resist lines which are used as a mask in etching of the underlying material).

FIGS. 2A and 2B illustrate a second type of a conventional lithography mask 100a. The second conventional lithography mask 100a includes a transparent substrate 102 and a layer of substantially opaque material 108 that has been patterned with patterning features 104a. In one aspect, the patterning features 104a are openings 106 that extend to the surface of the transparent substrate 102. In another aspect, the patterning features 104a include a transparent material within the opening 106.

The second conventional lithography mask 100a is preferably used in conjunction with a negative photoresist. The mask 100a may be interposed between a radiation source and a wafer or device die with a photoresist layer on top. Radiation from the radiation source passes through the transparent substrate and the patterning features 104a in the substantially opaque material 108 to the negative photoresist below. The exposed negative photoresist is developed, that is, rendered insensitive sensitive to ashing or development. The exposed photoresist, corresponding to the patterning features 104a remains while the unexposed photoresist portions are removed by ashing or other methods. The remaining rail shaped resist lines which are used as a mask in etching of the underlying material.

FIG. 3A illustrates a conventional lithography mask 100b configured for producing a NAND string. The conventional lithography mask 100b includes patterning features WL, SG, and SRAF dimensioned and arranged to form word lines (WL) and select gates (SG) in the NAND string below the photoresist. In the conventional design, vertical (running parallel to the select gate features SG where the length of the SRAF is parallel to the SG length) sub-resolution assist features SRAF are provided between pairs of select gate features SG. As discussed above, the vertical SRAFs improve the contrast of the image and thereby improve the definition of the printed image in the underlying photoresist.

Figure 3B:
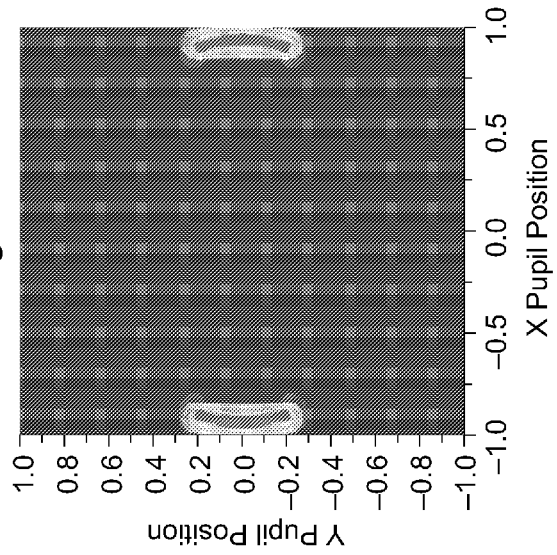
FIG. 3B is a plot illustrating high numerical aperture dipole illumination used with the mask of FIG. 3A.

At the current state of the art, 38 nm pitch, 19 nm feature size (half pitch), phase shifting with dipole illumination uses illumination with a high numerical aperture (FIG. 3B) (the higher the numerical aperture, the smaller the pitch that can be produced). For example, a numerical aperture of 1.35 may be achieved with immersion lithography. As illustrated in FIG. 3B, however, use of a numerical aperture of 1.35 and large units of partial coherence ($\sigma_{in}$=0.88, $\sigma_{out}$=0.98) results in a very narrow radiation beam passing through the mask 100b.

Figure 3C:
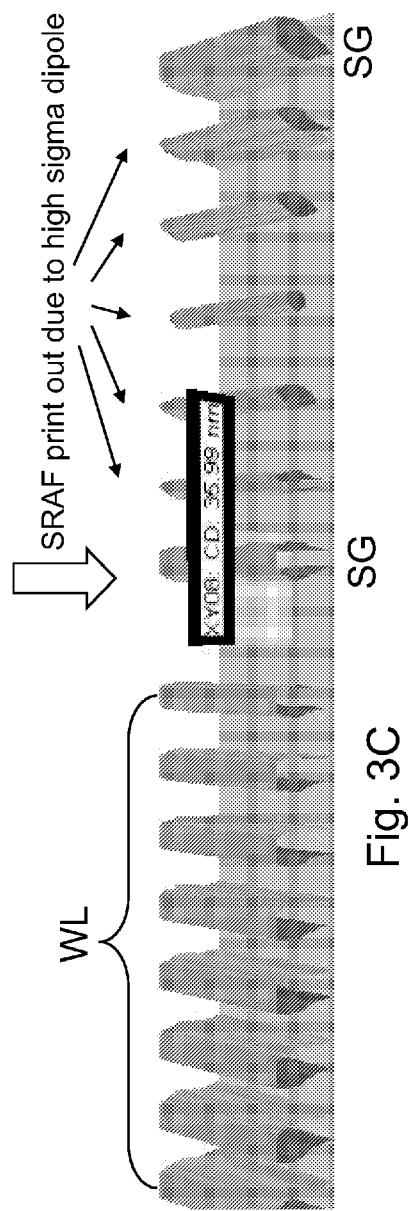
FIG. 3C is a simulation illustrating the pattern formed with the use of conventional lithography mask of FIG. 3A.

FIG. 3C illustrates the results of a simulation using the conventional lithography mask 100b with the dipole illumination illustrated in FIG. 3B. As illustrated in the simulation, photoresist regions the word lines WLx and the select gates SGx can be printed in the photoresist layer over the device substrate. However, under the aforementioned process conditions, the SRAF artifacts SRAFx print out in the photoresist layer as well. These artifacts interfere with further fabrication processes. Therefore, it would be advantageous to have a lithography mask capable of making devices with a small feature size and pitch, such as 19 nm feature size (38 nm pitch).

FIG. 4 is a side by side comparison of the layouts of two conventional masks and a mask of an embodiment of the present invention. Panel (a) illustrates a conventional lithography mask with vertical SRAF 110b (the same as in FIG. 3A). Panel (b) illustrates conventional lithography mask with island/hole SRAF 100c. Panel (c) illustrates an embodiment of a lithography mask with horizontal SRAF 400. The Island/hole SRAF comprise a series of small equi-dimensioned features, which do not contact the WL and SG patterning features. Island/hole SRAF may be formed in a single line (1×n) or in a matrix (n×m).

Unlike the conventional masks 100b, 100c, the horizontal SRAF lithography mask 400 illustrated in FIG. 4(c) includes horizontal, rail shaped sub-resolution assist features SRAF1, SRAF2 that are perpendicular or substantially perpendicular to the patterning features, word lines WL and select gates SG. The inventors have unexpectedly discovered that with the use of horizontal sub-resolution assist features, 38 nm features with a 76 nm pitch can be printed in the photoresist without the SRAF artifacts being printed in the photoresist. Indeed, printing with SRAFs perpendicular to and connecting to the patterning features to be printed is believed to be contrary to conventional methods. A first end of each SRAF connects to a side of a first of the two adjacent patterning features. A second end of each SRAF connects to a side of a second of the two adjacent patterning features.

As illustrated, the horizontal SRAF lithography mask 400 includes two sets of horizontal sub-resolution assist features SRAF1, SRAF2. The first set of horizontal sub-resolution assist features SRAF1 run between adjacent select gate patterning features SG which are used to image select gates of adjacent NAND strings located over a semiconductor channel. The second set of horizontal sub-resolution assist features SRAF2 run between a word line WL patterning feature and an adjacent select gate SG patterning feature which are used to image adjacent word line (e.g., control gate) and select gate of a NAND string. In alternative embodiments the horizontal SRAF lithography mask 400 may include only the first set of horizontal sub-resolution assist features SRAF1 or the second set of horizontal sub-resolution assist features SRAF2. Preferably, the horizontal sub-resolution assist features SRAF1 connect to two adjacent patterning features SG, while SRAF2 connect to adjacent WL and SG patterning features.

Figure 5B:
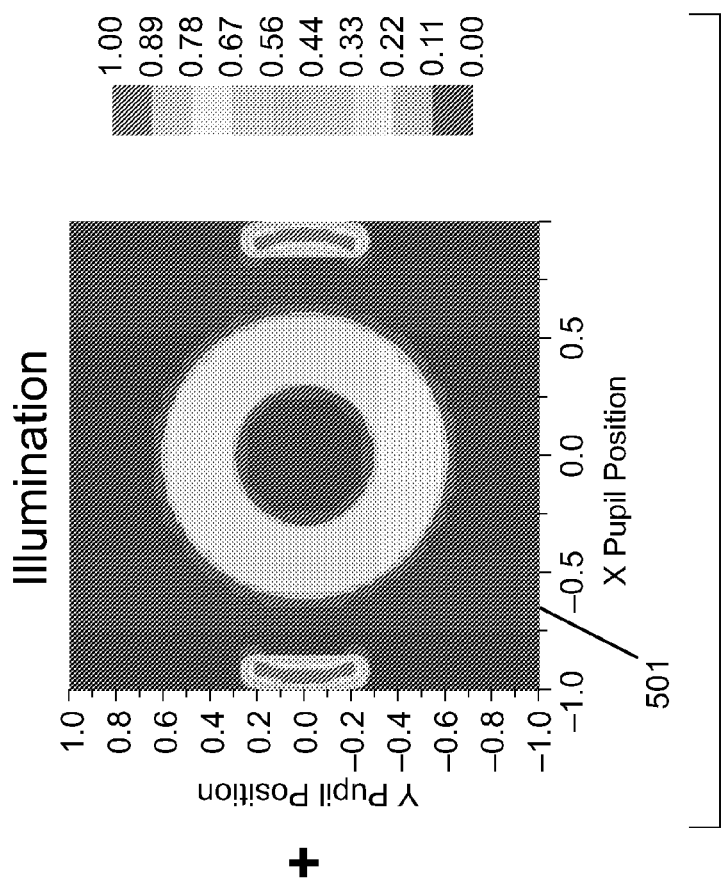
FIG. 5B is a plot illustrating dipole illumination that may be used with the mask of FIG. 5A.
Figure 5A:
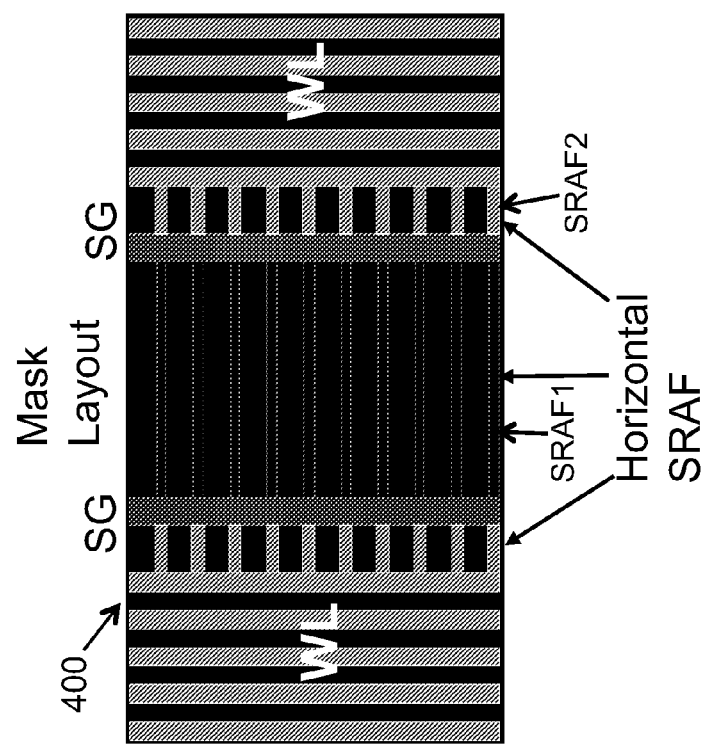
FIG. 5A illustrates an embodiment of a horizontal SRAF lithography mask for a NAND string.

FIG. 5A is an enlarged illustration of the horizontal SRAF mask 400 illustrated in FIG. 4(c). The horizontal SRAF mask 400 may be used for patterning NAND strings usable, for example, in a non-volatile memory. The features denoted as SG may correspond to select gates while the features marked WL may correspond to the word lines of the transistors of the NAND string. In an embodiment, the features denoted as SG are drain side NAND select gates of adjacent NAND strings and are spaced apart approximately 400 nm. In this embodiment, the first horizontal sub-resolution assist features SRAF1 preferably have a width of less than 25 nm and a pitch less than 75 nm.

In another embodiment, the features denoted as SG are adjacent source side NAND select gates of adjacent NAND strings and are spaced apart approximately 150 nm. In this embodiment, the first horizontal sub-resolution assist features SRAF1 preferably have a width of less than 25 nm and a pitch less than 75 nm. In another embodiment, the first patterning feature SG is a NAND select gate, the second patterning features WL are NAND word lines or control gates and the distance between a NAND select gate and an adjacent NAND control gate of NAND string is approximately 38 nm. Other embodiments of the horizontal SRAF mask 400 may include combinations of any or all of the above embodiments.

FIG. 5B is a plot illustrating dipole illumination passed through a dipole lens that may be used with the mask of FIG. 5A. In contrast to the dipole illumination illustrated in FIG. 3B for the conventional SRAF lithography masks 100b, the horizontal sub-resolution assist features SRAF1, SRAF 2 interact with the central pole 501 of the dipole illumination and do not print. After exposure, portions of the photoresist are selectively removed such that photoresist patterns corresponding to the plurality of patterning features are formed and no photoresist patterns corresponding to the SRAFs are formed. A layer, such as a conductive gate layer located above a semiconductor channel and below the photoresist patterns is etched using the photoresist patterns as a mask to form line shaped features (e.g., gate electrodes) in the layer followed by removing the photoresist patterns.

FIGS. 6A and 6B illustrate simulations of patterns in a photoresist produced with an embodiment of a horizontal SRAF lithography mask 400. The simulation in FIG. 6A was produced based on a focused radiation source, while the simulation illustrated in FIG. 6B was made based on the use of a defocused radiation source (defocus of about 50 nm). As can be seen in both simulations, the desired features L1, S0 are printed in the resist without any SRAF printing. L1 and S0 rail shaped resist regions may be used as a mask during etching of an underlying doped polysilicon, metal or silicide layer to form control and select gates. While fabrication of NAND gates have been described above, it should be noted that the perpendicular SRAF lithography method may be used to pattern any suitable feature in any type of a device.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a NAND string, comprising:
    depositing a photoresist layer over a NAND gate layer located over a substrate;
    exposing the photoresist layer to radiation though a lithography mask, the lithography mask comprising:
        a plurality of patterning features formed on a mask substrate; and
        a first plurality of sub-resolution assist features (SRAFs) formed on the mask substrate;
    wherein:
        the plurality of patterning features are dimensioned equal to or greater than a resolution limit of a lithography system used with the lithography mask, the lithography system having a lithography radiation source;
        each of the plurality of patterning features has a length greater than a width;
        the plurality of patterning features extend in a first longitudinal direction along their length on the mask substrate;
        the plurality of patterning features correspond in shape to NAND select gates and NAND control gates;
        the first plurality of SRAFs are dimensioned less than a resolution limit of the lithography system used with the lithography mask;
        each of the first plurality of SRAFs has a length greater than a width;
        the first plurality of SRAFs extend in a second longitudinal direction along their length on the mask substrate, where the second longitudinal direction is substantially perpendicular to the first longitudinal direction;
        the first plurality of SRAFs are located between two adjacent patterning features;
        a first end of each of the first plurality of SRAFs connects to a side of a first of the two adjacent patterning features; and
        a second end of each of the first plurality of SRAFs connects to a side of a second of the two adjacent patterning features; and
    selectively removing portions of the photoresist layer such that photoresist patterns corresponding to the plurality of patterning features are formed and no photoresist patterns corresponding to the SRAFs are formed; and
    etching the NAND gate layer using the photoresist patterns as a mask to form a plurality of NAND control gates and select gates.

2. The method claim 1, wherein each of the plurality of patterning features corresponds in shape to either the NAND select gate or the NAND control gate.

3. The method of claim 2, further comprising a second plurality of SRAFs formed on the mask substrate, wherein:
    the second plurality of SRAFs are dimensioned less than a resolution limit of the lithography system used with the lithography mask;
    each of the second plurality of SRAFs has a length greater than a width;
    the second plurality of SRAFs extend in the second longitudinal direction along their length on the mask substrate,
    the second plurality of SRAFs are located between the first of the two adjacent patterning features and a third patterning feature of the plurality of patterning features;
    the third patterning feature of the plurality of patterning features is located adjacent to an opposite side of the first of the two adjacent patterning features from a location of the first plurality of SRAFs;
    a first end of each of the second plurality of SRAFs connects to a side of the first of the two adjacent patterning features; and
    a second end of each of the second plurality of SRAFs connects to a side of the third patterning feature of the plurality of patterning features.

4. The method of claim 3, wherein:
    the first of the two adjacent patterning features corresponds in shape to a first source or drain side NAND select gate;
    the second of the two adjacent patterning features corresponds in shape to an adjacent second source or drain side NAND select gate;
    the first and the second adjacent patterning features are spaced apart a first predetermined distance to pattern an adjacent first and second source or drain side NAND select gates spaced apart approximately 150 nm or more;
    each of the first plurality of SRAFs has a length equal to the first predetermined distance to pattern adjacent first and second source or drain side NAND select gates;
    each of the first plurality of SRAFs has a width of less than 25 nm;
    the first plurality of SRAFs have a pitch less than 75 nm;
    the third patterning feature of the plurality of patterning features corresponds in shape to the NAND control gate;
    the first and the third patterning features are spaced apart a second predetermined distance to pattern an adjacent NAND select gate and NAND control gate spaced apart approximately 38 nm;
    each of the second plurality of SRAFs have a length equal to the second predetermined distance;
    each of the second plurality of SRAFs have a width of less than 25 nm; and
    the second plurality of SRAFs have a pitch less than 75 nm.

5. The method claim 4, wherein:
    the photoresist layer is exposed a single time to form the photoresist patterns; and
    the step of etching the NAND gate layer using the photoresist patterns as a mask forms the following NAND gates over a semiconductor channel:
        two adjacent drain side NAND select gates which are spaced apart approximately 400 nm;
        two adjacent source side NAND select gates which are spaced apart approximately 150 nm;
        a plurality of adjacent NAND control gates of the NAND string;

a first end NAND control gate of the NAND string is spaced apart from an adjacent source side NAND select gate by approximately 38 nm; and a second end NAND control gate of the NAND string is spaced apart from an adjacent drain side NAND select gate by approximately 38 nm.

6. The method of claim 2, wherein:

the first of the two adjacent patterning features corresponds in shape to a first drain side NAND select gate;

the second of the two adjacent patterning features corresponds in shape to an adjacent second drain NAND select gate;

the first and the second adjacent patterning features are spaced apart a predetermined distance to pattern adjacent drain side NAND select gates spaced apart approximately 400 nm;

each of the first plurality of SRAFs has a length of equal to the predetermined distance to pattern adjacent drain side NAND select gates;

each of the first plurality of SRAFs has a width of less than 25 nm;

the first plurality of SRAFs have a pitch less than 75 nm; and the step of etching the NAND gate layer using the photoresist patterns as a mask forms two adjacent drain side NAND select gates which are spaced apart approximately 400 nm.

7. The method of claim 2, wherein:

the first of the two adjacent patterning features corresponds in shape to a first source side NAND select gate;

the second of the two adjacent patterning features corresponds in shape to an adjacent second source side NAND select gate;

the first and the second adjacent patterning features are spaced apart a predetermined distance to pattern adjacent source side NAND select gates spaced apart approximately 150 nm;

each of the first plurality of SRAFs has a length equal to the predetermined distance to pattern adjacent source side NAND select gates;

each of the first plurality of SRAFs has a width of less than 25 nm;

the first plurality of SRAFs have a pitch less than 75 nm; and the step of etching the NAND gate layer using the photoresist patterns as a mask forms two adjacent source side NAND select gates which are spaced apart approximately 150 nm.

8. The method of claim 2, wherein:

the first of the two adjacent patterning features corresponds in shape to the NAND select gate;

the second of the two adjacent patterning features corresponds in shape to the NAND control gate;

the first and the second adjacent patterning features are spaced apart a predetermined distance to pattern an adjacent NAND select gate and NAND control gate spaced apart approximately 38 nm;

each of the first plurality of SRAFs has a length equal to the predetermined distance to pattern an adjacent NAND select gate and NAND control gate;

each of the first plurality of SRAFs has a width of less than 25 nm;

the first plurality of SRAFs have a pitch less than 75 nm; and the step of etching the NAND gate layer using the photoresist patterns as a mask forms adjacent NAND select gate and NAND control gate which are spaced apart approximately 38 nm.

9. The method of claim 1, further comprising providing a fluid between the lithography mask and the photoresist layer such that the step of exposing comprises an immersion lithography step.

* * * * *